US006871056B2

(12) United States Patent
Cho et al.

(10) Patent No.: US 6,871,056 B2
(45) Date of Patent: Mar. 22, 2005

(54) NON-RADIATIVE DIELECTRIC WAVEGUIDE MIXER USING A RING HYBRID COUPLER

(75) Inventors: Dong Jin Cho, Ulsan (KR); Young Geun Yoo, Ulsan (KR)

(73) Assignee: NRD Co. Ltd. (KR)

( * ) Notice: Subject to any disclaimer, the term of this patent is extended or adjusted under 35 U.S.C. 154(b) by 675 days.

(21) Appl. No.: 09/847,668

(22) Filed: May 2, 2001

(65) Prior Publication Data

US 2002/0132601 A1 Sep. 19, 2002

(30) Foreign Application Priority Data

Feb. 1, 2001 (KR) .................................... P.10-2001-4826

(51) Int. Cl.[7] ................................................ H04B 1/26
(52) U.S. Cl. ...................... 455/313; 455/318; 455/319; 455/326; 455/328
(58) Field of Search .............................. 455/313, 330, 455/319, 316, 318, 323, 326, 327, 328; 333/116, 25; 327/100

(56) References Cited

U.S. PATENT DOCUMENTS

| | | | | | |
|---|---|---|---|---|---|
| 3,932,815 A | * | 1/1976 | Yuan et al. | ................. | 455/326 |
| 4,418,429 A | * | 11/1983 | Roberts | ...................... | 455/328 |
| 4,480,336 A | * | 10/1984 | Wong et al. | ................. | 455/328 |
| 4,492,960 A | * | 1/1985 | Hislop | ........................ | 455/323 |
| 4,697,161 A | * | 9/1987 | Buoli | ......................... | 333/116 |
| 5,020,148 A | * | 5/1991 | Bonato | ....................... | 455/319 |
| 5,428,840 A | * | 6/1995 | Sadhir | ........................ | 455/327 |
| 5,678,225 A | * | 10/1997 | Kobayashi | .................. | 455/330 |
| 5,774,801 A | * | 6/1998 | Li et al. | ..................... | 455/318 |
| 5,854,974 A | * | 12/1998 | Li | .............................. | 455/326 |
| 5,977,874 A | * | 11/1999 | Konstandelos | .............. | 340/554 |
| 6,275,689 B1 | * | 8/2001 | Gill | ............................ | 455/323 |

* cited by examiner

*Primary Examiner*—Edward F. Urban
*Assistant Examiner*—Lana N. Le
(74) *Attorney, Agent, or Firm*—Ostrolenk, Faber, Gerb & Soffen, LLP

(57) ABSTRACT

Disclosed is a NRD waveguide mixer adopting a ring hybrid coupler applicable to a small-sized and high functional millimeter wave receiving/transmitting device. The NRD waveguide has a housing including two parallel conductive plates. The ring hybrid coupler is installed in the housing and has an annular ring formed with first to fourth ports which are radially extended about the annular ring. An oscillating device is connected to the first port so as to generate a local oscillating signal. A rod antenna is connected to the second port so as to receive/transmit a radio frequency signal. A first balanced mixer mount is connected to the third port and is provided with a first Schottky diode. A second balanced mixer mount is connected to the fourth port and is provided with a second Schottky diode. The radio frequency signal and the oscillating signal inputted from the first and second ports are mixed in the ring hybrid coupler to be transformed into an addition signal and a subtraction signal. The addition and subtraction signals are transmitted to the third and fourth ports to switch the Schottky diodes respectively so that an intermediate signal is generated.

5 Claims, 9 Drawing Sheets

NON-RADIATIVE DIELECTRIC WAVEGUIDE MIXER USING A RING HYBRID COUPLER

TECHNICAL FIELD OF THE INVENTION

The present invention relates to a non-radiative dielectric (NRD) waveguide mixer adopting a ring hybrid coupler, and more particularly, to a NRD waveguide mixer which employs a ring hybrid coupler with a simple structure utilizing a NRD waveguide and is applicable to a millimeter wave integrated circuits.

BACKGROUND OF THE PRESENT INVENTION

Recently, as a mobile telecommunication system and telecommunication devices have been rapidly digitalized, it is commonly required to employ a telecommunication system having a speedy and powerful data processing capacity. Since the telecommunication system is required to process and communicate a great deal of information, its frequency band has been expanded from a microwave band to a millimeter wave band. In a wireless telecommunication system using the millimeter wavelength, it was usually manufactured as a hybrid type module. Recently, as semiconductor technology makes great strides, the wireless telecommunication system has been developed to employ a single chip of a monolithic microwave integrated circuit (MMIC). Although the hybrid type, as a conventional type, is less competitive than the MMIC in terms of price and mass production, it may be advantageously adopted to manufacture the wireless telecommunication system in small lots.

Nowadays, many attentions have been paid to a NRD waveguide since it can be easily manufactured as compared with the hybrid type and can transmit signals in a longitudinal-section magnetic (LSM) mode with a low transmission loss.

Figure 1:
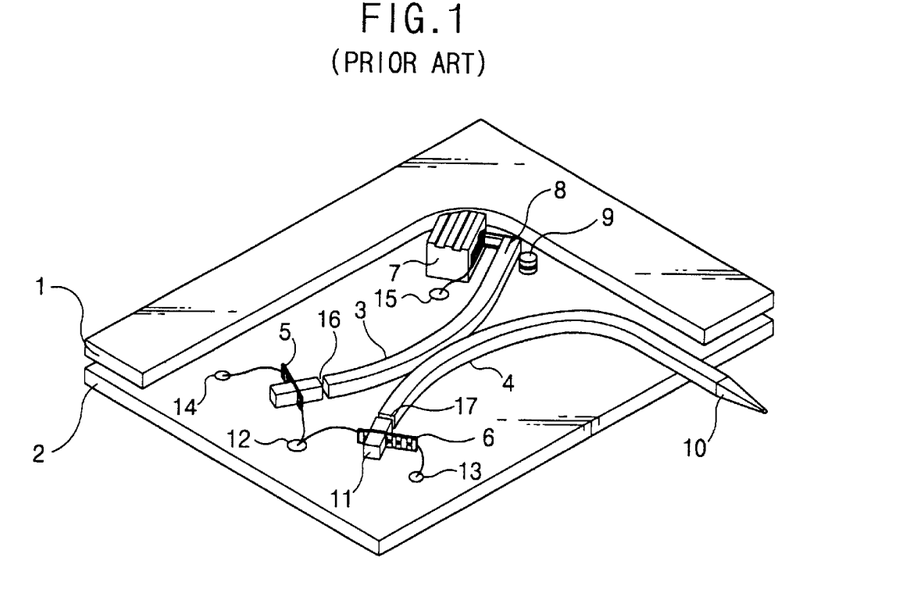
FIG. 1 is a perspective view showing the whole structure of a signal receiving device adopting the principle of a conventional parallel NRD line coupler and a balanced mixer.
Figure 2:
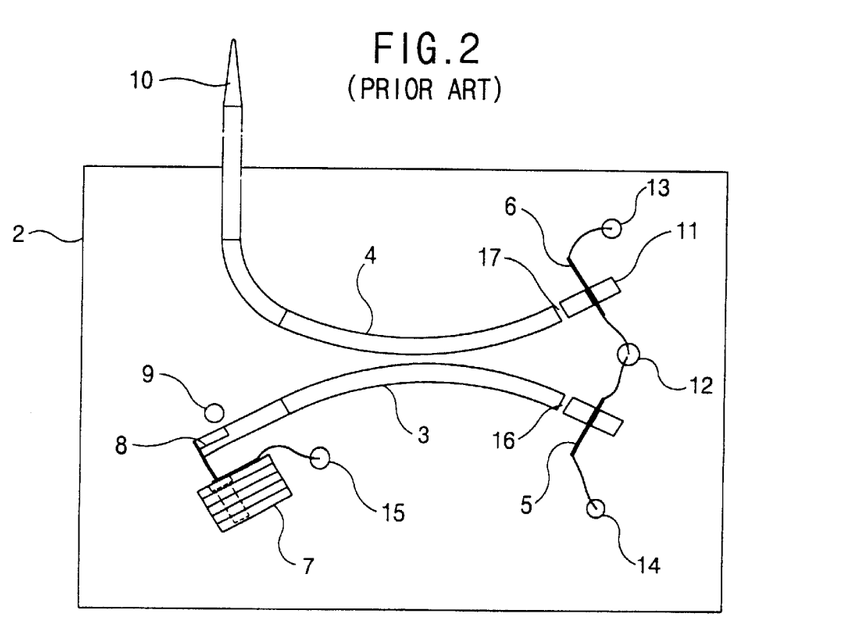
FIG. 2 is a plan view of the signal receiving device shown in FIG. 1.

FIGS. 1 and 2 show the structure of a conventional signal receiving device adopting a NRD waveguide multi-layer type. The signal receiving device has an upper conductive plate 1 and a lower conductive plate 2 which is positioned in parallel to the upper conductive plate 1. Dielectric lines 3 and 4 are arranged between the upper and lower conductive plates 1 and 2. A radio frequency signal and a local oscillating signal are inputted into the signal receiving device through the dielectric lines 3 and 4. A horn antenna (not shown) is attached to a rod antenna 10 for receiving/transmitting the signals. When the radio frequency signal is inputted into the rod antenna 10, a bias signal is applied to a Gunn diode (not shown) mounted in a diode mount 7 so that the local oscillating signal is generated. At this time, a longitudinal-section electric (LSE) mode is created. However, the LSE mode is suppressed by a mode suppressor 8. Then, the radio frequency signal passes through a dielectric resonator 9 so that a transferring gain increases at a predetermined frequency band and an intermediate frequency (IF) signal is outputted from two ports 16 and 17 through a 3-dB coupler having a bend shape. The signals outputted from the two ports 16 and 18 are introduced into Schottky diodes of a pair of balanced mixer mounts 5 and 6 and are inputted into an intermediate frequency (IF) terminal 12. Each of the Schottky diodes receives a bias 13 having a predetermined voltage and is grounded by a ground 14 so that a closed circuit is formed.

FIG. 1 represents the typical structure of the signal receiving device using the NRD waveguide. The coupler is fabricated by bending the dielectric lines based on the principle of a parallel dielectric line coupler. In designing bending angles of the dielectric lines, an established database with respect to proper widths and the bending angles of the dielectric lines are used.

However, in fabricating the dielectric coupler having the above structure in a small size, it is not a good choice to reduce lengths of the bend dielectric lines. Accordingly, it is inevitable to bend the dielectric lines much more, but this choice may cause a large error range in fabricating them. A bend dielectric line may cause a transmission loss at a bending portion if the width of the dielectric line is not adaptively reduced with respect to respective bending angles corresponding frequencies. In the fabrication, the reducing of the width without causing a large error is very difficult. Furthermore, it is also difficult to precisely design and fabricate the bending angles, the distance between the dielectric lines and the isolation degree between ports. In addition, if the dielectric coupler is fabricated in a small size with a light weight, the width of the bending portion has to be reduced to enlarge the bending angle. However, it is difficult to precisely reduce the width of the dielectric line which is usually made of Teflon.

SUMMARY OF THE INVENTION

It is an object of the present invention to provide a NRD waveguide mixer capable of enhancing the isolation degree between ports by adopting a ring hybrid coupler which can be fabricated in a small size and can be easily manufactured without bending dielectric lines.

To accomplish the object of the present invention, there is provided a NRD waveguide mixer including a housing which has a pair of opposed parallel conductive plates. The NRD waveguide mixer also includes a ring hybrid coupler having an annular ring and first to fourth ports radially extending from the annular ring, an oscillating device connected to the first port so as to generate a local oscillating signal, a rod antenna connected to the second port so as to receive/transmit a radio frequency signal, a first balanced mixer mount connected to the third port and provided with a first Schottky diode, and a second balanced mixer mount connected to the fourth port and provided with a second Schottky diode. Particularly, the radio frequency signal inputted from the first port and the oscillating signal inputted from the second port are mixed in the ring hybrid coupler to be transformed into an addition signal and a subtraction signal, and the addition and subtraction signals are transmitted to the third and fourth ports to switch the first and second Schottky diodes, respectively, so that an intermediate signal is generated.

Preferably, the first and second ports make contact with the annular ring to form T-junctions. For a good impedance matching, an inductive iris made of a conductive thin plate is attached to each of the T-junctions or a conductive post is accommodated in each of the T-junctions.

Preferably, for the good impedance matching, stubs are provided at an inner side of the annular ring in directions opposite to the extending directions of the first and second ports, respectively.

Preferably, the first to fourth ports have the same characteristic impedance Zo. The annular ring has a characteristic impedance of $Zo/\sqrt{2}$. A circumference length of the annular ring at a middle portion thereof is substantially $\lambda$, and the first to fourth ports are spaced by $\lambda/4$ from each other.

Preferably, the first to fourth ports are arranged around the annular ring in a clockwise direction in order of the first, third, second and fourth ports. When a diameter of the annular ring is 6λ/4, the first port is spaced from the third port by 3λ/4, the second port is spaced from the third port by λ/4, the second port is spaced from the fourth ports by λ/4, and the first port is spaced from the fourth port by λ/4 in such a manner that the first to fourth ports have phase differences with respect to each other.

BRIEF DESCRIPTION OF THE DRAWINGS

The above object and other advantages of the present invention will become more apparent by describing in detail a preferred embodiment thereof with reference to the attached drawings, in which.

DETAILED DESCRIPTION OF THE PREFERRED EMBODIMENT

Hereinafter, the present invention will be described in detail with reference to the accompanying drawings.

Figure 3:
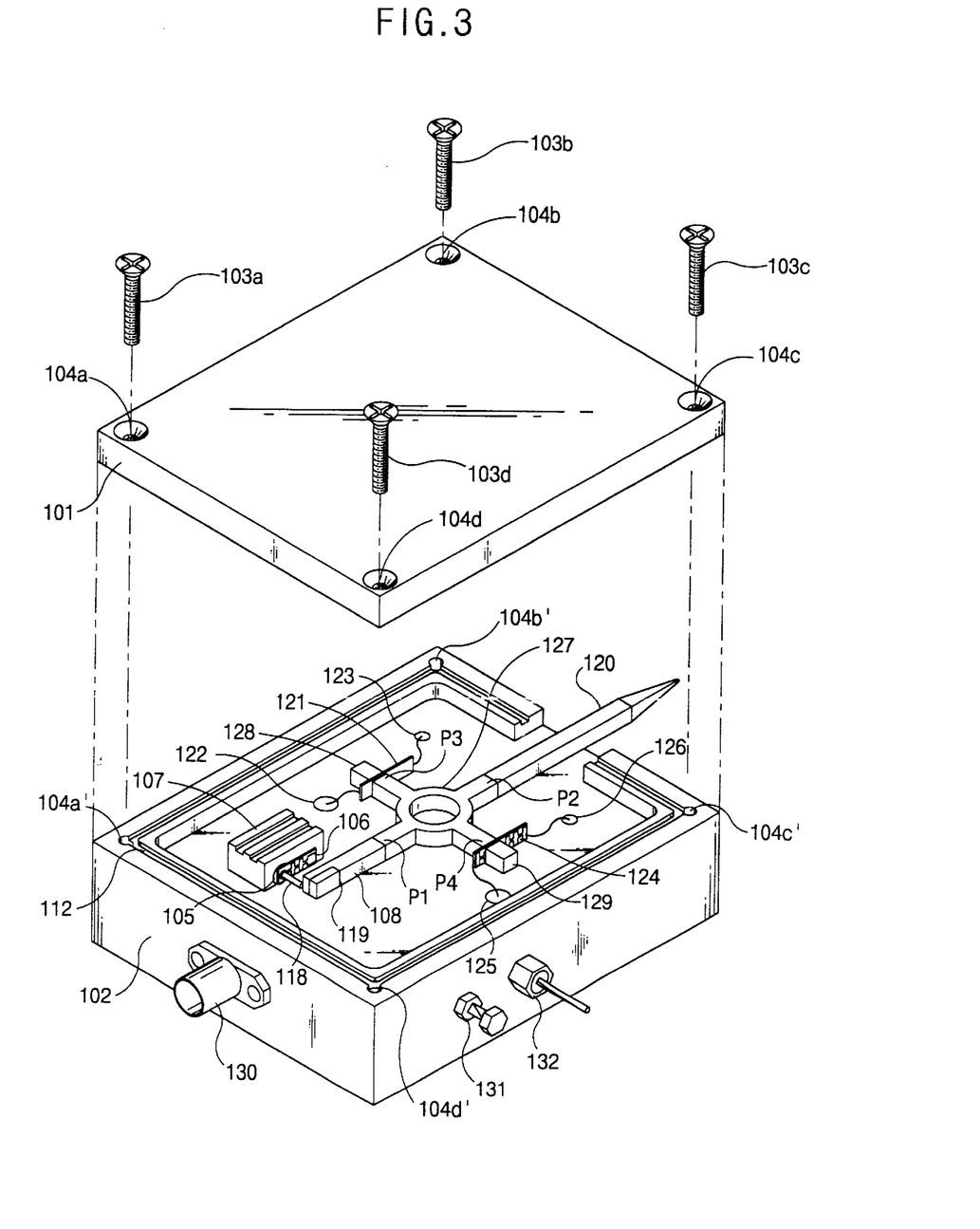
FIG. 3 is an exploded perspective view showing a NRD waveguide mixer adopting a ring hybrid coupler according to one embodiment of the present invention.
Figure 4:
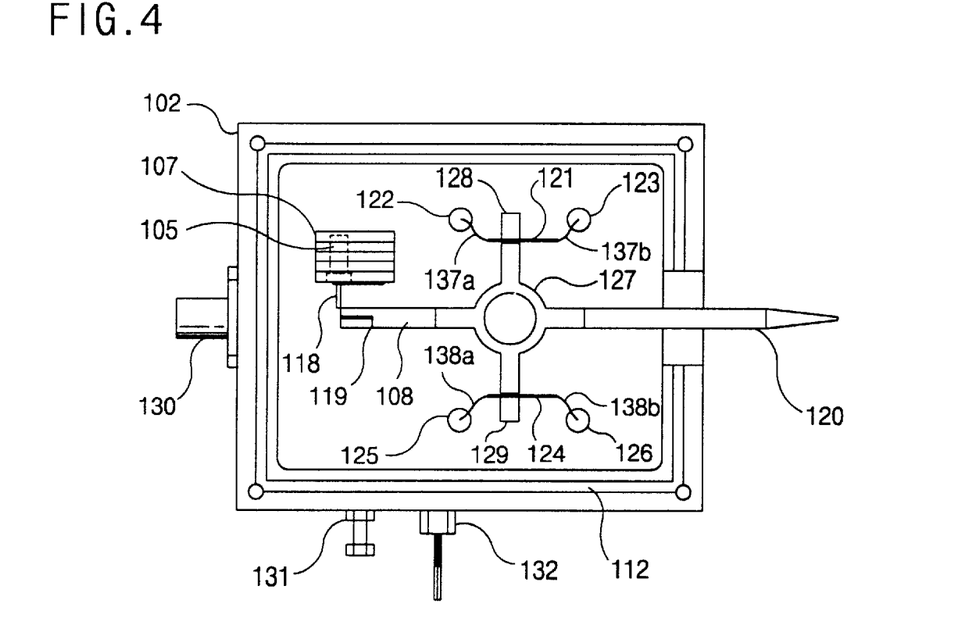
FIG. 4 is a plan view of the NRD waveguide mixer shown in FIG. 3.
Figure 5:
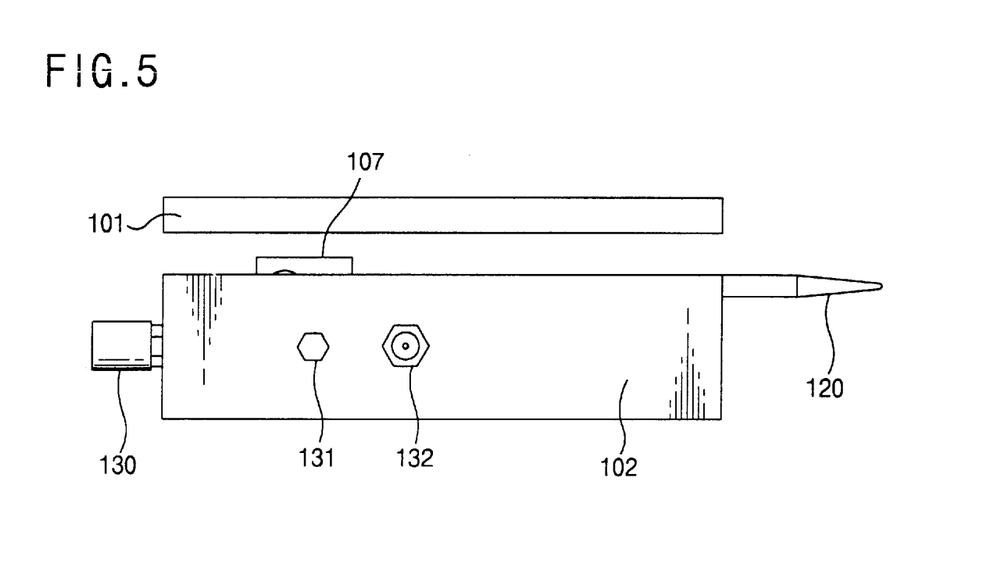
FIG. 5 is a front view of the NRD waveguide mixer shown in FIG. 3.
Figure 6:
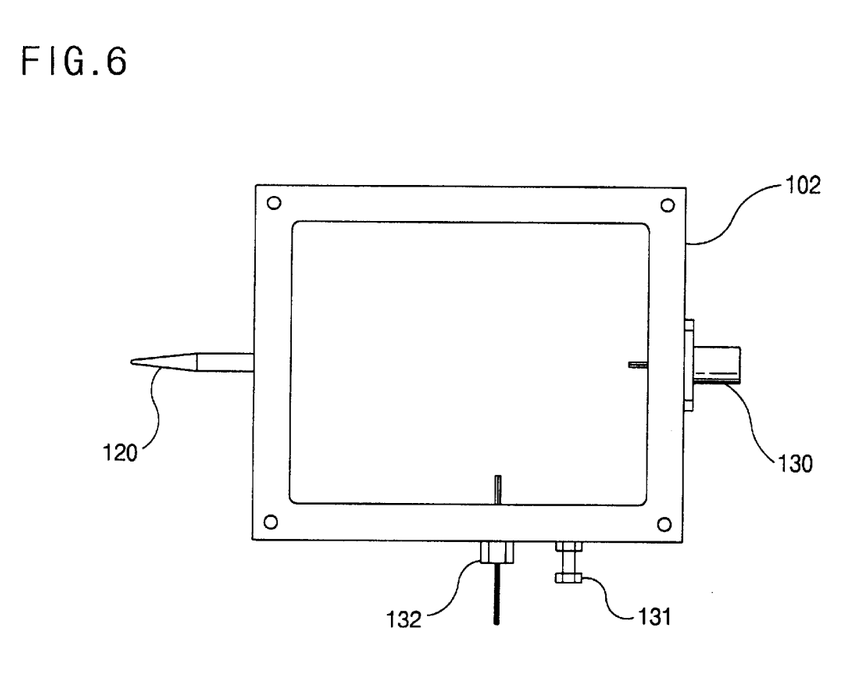
FIG. 6 is a bottom view of the NRD waveguide mixer shown in FIG. 3.
Figure 7:
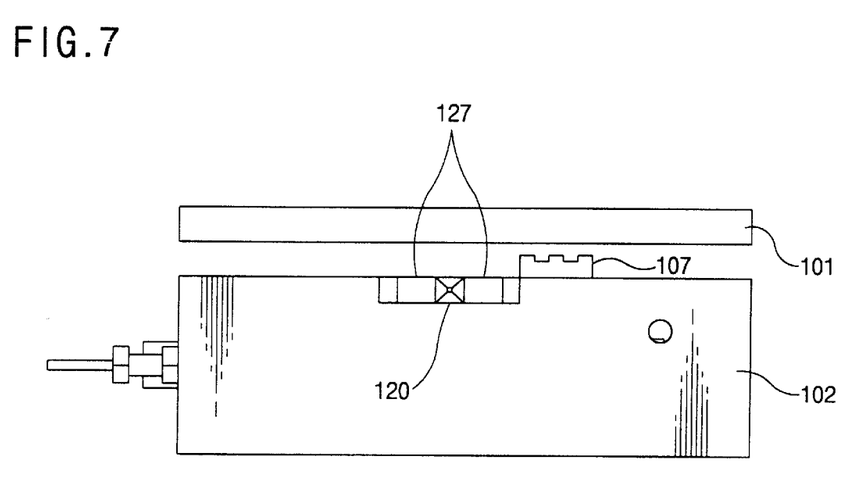
FIG. 7 is a right-side view of the NRD waveguide mixer shown in FIG. 3.

FIG. 3 shows the structure of a NRD waveguide mixer according to one embodiment of the present invention in which an upper conductive plate 101 is separated from a lower conductive plate 102. In addition, FIG. 4 shows a plan view of the NRD waveguide mixer shown in FIG. 3 in which the upper conductive plate 101 is removed.

It is one of main features of the present invention that the NRD waveguide mixer has a ring hybrid coupler 127. The ring hybrid coupler 127 includes an annular ring having a predetermined width and first to fourth ports P1, P2, P3 and P4 which radially and outwardly extend about the annular ring. The first port P1 is connected to a dielectric line 108 accommodating a mode suppressor 119 and the second port P2 is connected to a rod antenna 120 for receiving/transmitting signals. In addition, the third port P3 is connected to a dielectric line 128 by interposing a first mixer mount 121, and the fourth port P4 is connected to a dielectric line 129 by interposing a second mixer mount 124. In practice, the first port P1 can be integrally formed with the dielectric line 108 and the second port P2 can be integrally formed with the rod antenna 120.

A Gunn diode 105 is provided to generate a local oscillating signal. The Gunn diode 105 is installed in a diode mount 107. The local oscillating signal is introduced into the dielectric line 108 through a radio frequency supplying line 118. The radio frequency supplying line 118 is vertically arranged on the same plane of the mode suppressor 119.

The hybrid coupler 127 and elements connected thereto are installed in the lower conductive plate 102. A plurality of coupling holes 104a, 104b, 104c and 104d and a plurality of screw holes 104a', 104b', 104c' and 104d' corresponding to the coupling holes 104a, 104b, 104c and 104d are positioned at edge portions of the upper conductive plate 101 and the lower conductive plate 102, respectively. Screws 103a, 103b, 103c and 103d are coupled into the screw holes 104a', 104b', 104c' and 104d' through the coupling holes 104a, 104b, 104c and 104d. The upper and lower conductive plates 101 and 102 are assembled with each other, and thereby forming a housing in which the ring hybrid coupler is accommodated. The size of the housing can be varied depending on the frequency band of a signal receiving device and a signal transmitting device. The upper and lower conductive plates 101 and 102 are made of metals, such as aluminum, in order to allow the upper and lower conductive plates 101 and 102 to have high conductivity with a light weight. In addition, it is preferable that the ring hybrid coupler 127, the dielectric lines 108, 128 and 129 and the rod antenna 120 are made of one kind of dielectric material so that they can have the same dielectric constant.

A first IF terminal inputting hole 122 and a direct current bias inputting hole 123 are formed at both sides of the first mixer mount 121 of the lower conductive plate 102 and a second IF terminal inputting hole 125 and a mixer mount grounding hole 126 are formed at both sides of the second mixer mount 124. In addition, first ends of lead wires 137a and 137b are connected to both sides of the first mixer mount 121 and second ends of the lead wires 137a and 137b are connected to an IF terminal connector 130 and a central terminal of an electromagnetic interference (EMI) filter 132 for supplying the bias via the first IF terminal inputting hole 122, the direct current bias inputting hole 123, an IF circuit (not shown) and a bias supplying circuit (not shown). In addition, first ends of lead wires 138a and 138b are connected to both sides of the second mixer mount 124 and second ends of the lead wires 138a and 138b are connected to the IF terminal connector 130 and a grounding pin 131 via the second IF terminal inputting hole 125, the mixer mount grounding hole, the IF circuit and the bias supplying circuit.

Figure 8:
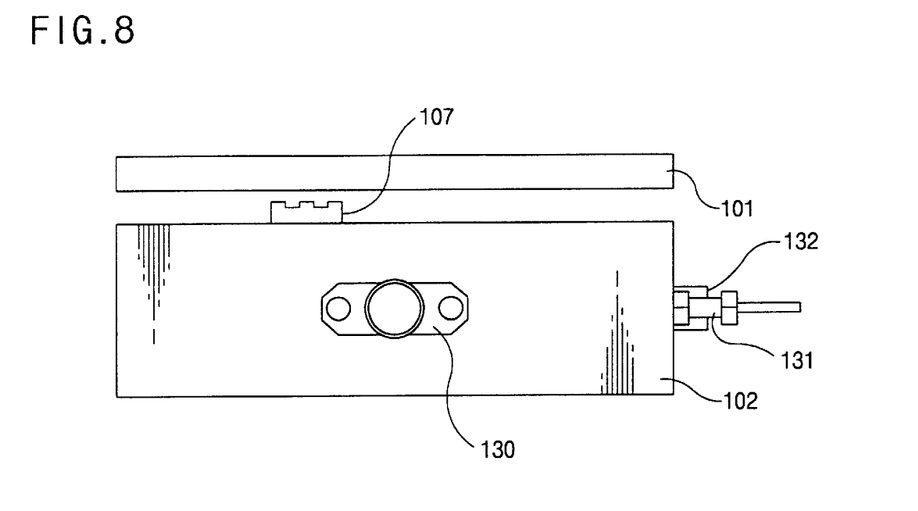
FIG. 8 is a left-side view of the NRD waveguide mixer shown in FIG. 3.

FIGS. 5 to 8 show a front view, a bottom view, a right-side view and a left side view of the NRD waveguide mixer shown in FIG. 3, respectively. The IF circuit and the bias supplying circuit can be installed at a bottom of the lower conductive plate 102. The position of the IF circuit and the bias supplying circuit can be varied depending on the design requirement. An IF circuit substrate and a lower lid of the conductive plate are omitted in the figures. The upper conductive plate 101 is spaced from the lower conductive plate 102 in FIG. 7. As shown in FIG. 8, the connector 130 is connected to one side of the lower conductive plate 102 for allowing the lower conductive plate 102 to be connected with other signal receiving/transmitting devices.

Figure 9:
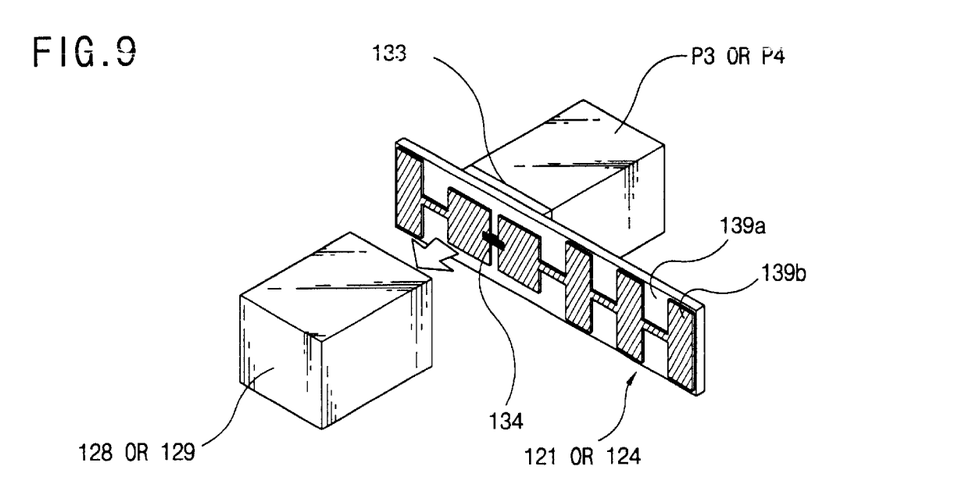
FIG. 9 is a perspective view showing the structure of a diode mount used in a balanced mixer.

FIG. 9 shows the structure of a diode mixer mount of the NRD waveguide mixer. A sheet 133 of a high dielectric constant is attached to the third port P3 or to the fourth port P4. Then, the mixer mount 121 or 124 and the dielectric line 128 or 129 are added thereon. The dielectric line 128 or 129 is installed so as to protect a Schottky diode 134. In order to fabricate the mixer mount 121 or 124, a patch antenna 139$b$ having a $\lambda/4$ choke circuit is manufactured by etching a copper film stacked on a dielectric substrate 139$a$ made of Teflon, and the Schottky diode 134 is coupled to the patch antenna 139$b$ crossing a gap of the patch antenna 139$b$.

The NRD waveguide mixer having the above structure is used as a signal receiver or as a signal transmitter of a wireless telecommunication appliance.

When the NRD waveguide mixer is used as the signal receiver, the direct current (DC) bias power supplied from the EMI filter 132 is transferred to the Gunn diode 105 after removing the harmonic components contained in the DC bias power by using a bias choke 106 so that an oscillating signal is generated. A power and a frequency of the oscillating signal are tuned by the length of the radio frequency signal supplying line 118. Then, the oscillating signal is transferred to the dielectric line 108 so that an LSM mode and an LSE mode are created. At this time, the LSE mode is rejected by the mode suppressor 119 and the LSM mode with a low transmission loss is transferred to the first port P1 of the ring hybrid coupler 127.

In addition, the radio frequency signal is inputted into the rod antenna through a horn antenna (not shown) and is transferred into the second port P2 of the ring hybrid coupler 127 in opposite to the local oscillating signal.

The local oscillating signal and the radio frequency signal transferred into the first and second ports P1 and P2 are transferred into the third and fourth ports P3 and P4 and are mixed therein. The third port P3 and the fourth port P4 have phase differences of $\lambda/4$ or $(4n+1)\lambda/4k$, wherein n is an integer. Accordingly, an IF signal, which is an addition signal of the local oscillating signal and the radio frequency signal, and a baseband signal which is a subtraction signal between the local oscillating signal and the radio frequency signal, are created by mixing the local oscillating signal and the radio frequency signal. For example, when the local oscillating signal of 59 GHz is transmitted to the first port P1 and the radio frequency signal of 60–61 GHz is inputted into the second port P2, a subtraction signal having the frequency of 1–2 GHz and an addition signal having the frequency of 119–120 GHz are generated from the third and fourth ports P3 and P4. At this time, the signal having the high frequency band is disregarded and the signal having the frequency of 1–2 GHz is utilized.

Figure 10:
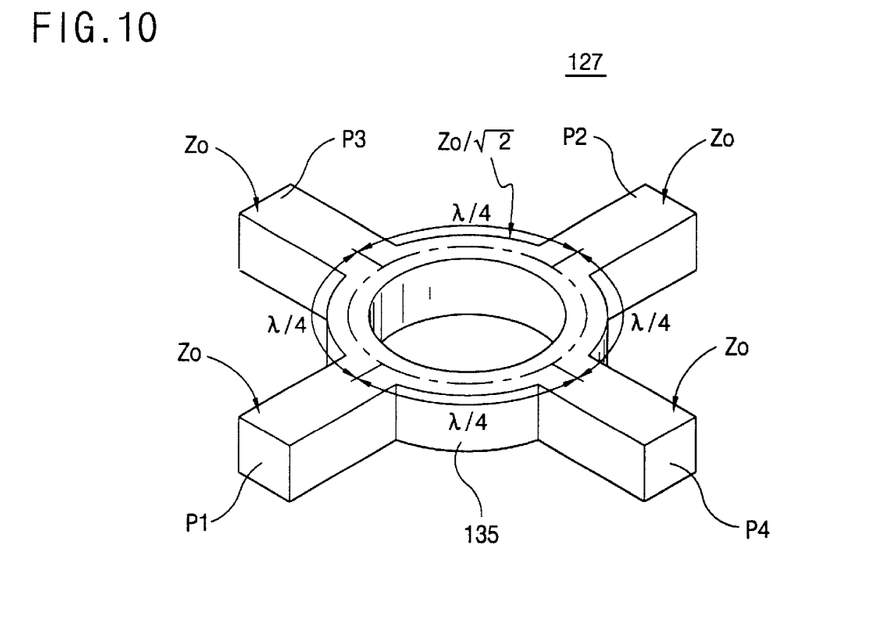
FIG. 10 is a perspective view showing the structure of the ring hybrid coupler according to a first embodiment of the present invention.

FIG. 10 shows the structure of the ring hybrid coupler 127. Characteristic impedances of the first to fourth ports P1, P2, P3 and P4 are identically predetermined as Zo and a characteristic impedance of an annular ring 135 is predetermined as $Zo/\sqrt{2}$ so as to obtain a desired coupling ratio. Accordingly, the impedance matching is achieved at each port, and the first and second ports P1 and P2 are separated to compensating the signals therethrough. In addition, the input power of the wave incident into the first and second ports P1 and P2 is uniformly distributed into the third and fourth ports P3 and P4.

A circumference length of the annular ring 135 at a middle portion thereof is substantially $\lambda$, and the first to fourth ports P1, P2, P3 and P4 are arranged around the annular ring 135 spaced by $\lambda/4$ from each other. Accordingly, the first port P1 to which the local oscillating signal is transmitted and the second port P2 into which the radio frequency is inputted have the phase difference of $2\lambda/4$, so the signals introduced into the third and fourth ports P3 and P4 from the first and second ports P1 and P2 have the phase difference of 180 degree. The signals are transmitted to the third and fourth ports P3 and P4 in the form of a compensated signal or a mixed signal.

The signals coupled in the annular ring 135 are transferred to the first and second mixer mounts 121 and 124 through the third and fourth ports P3 and P4 and are transformed into the IF signals and the baseband signals. For instance, the signals introduced into the third and fourth ports P3 and P4 pass the Schottky diode 134 mounted in the mixer mounts 121 and 124 through the dielectric lines 128 and 129. Then, the Schottky diode 134 performs the switching operation by receiving the bias signal through lead wires 137$b$ and 138$b$ so that the signals are transformed into IF signals through the lead wires 137$a$ and 138$a$. The IF signals are amplified while passing through the IF circuit and are outputted to the exterior through the connector 130. The bias signal is applied to the Schottky diode 134 through the EMI filter 132.

On the other hand, the operation is reversely carried out when the NRD waveguide mixer is used as the signal transmitter. That is, the IF signal is transmitted to the annular ring 135 through the third and fourth ports P3 and P4. In addition, the local oscillating signal is inputted into the annular ring 135 through the first port P1. The addition signal of the above two signals is radiated through the rod antenna 120.

Figure 11:
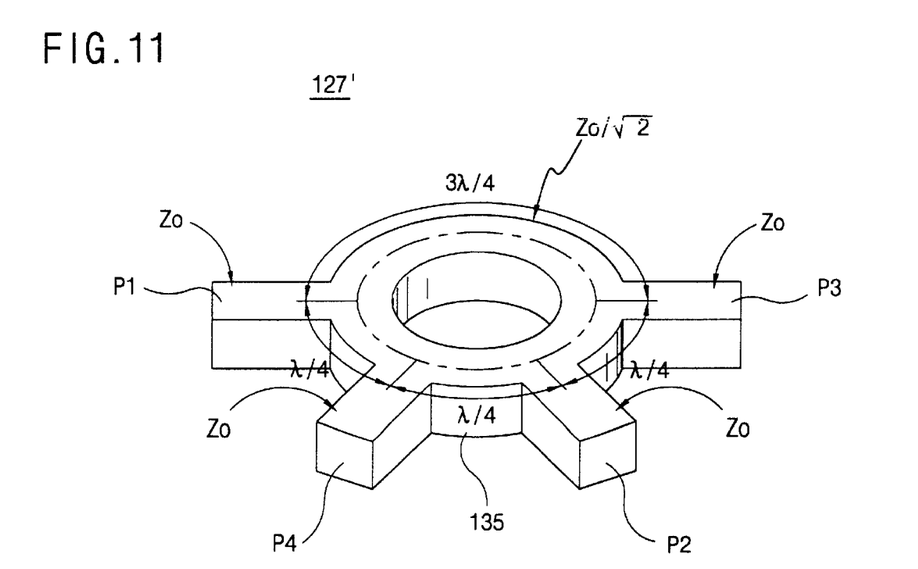
FIG. 11 is a perspective view showing the structure of the ring hybrid coupler according to a second embodiment of the present invention.
Figure 12:
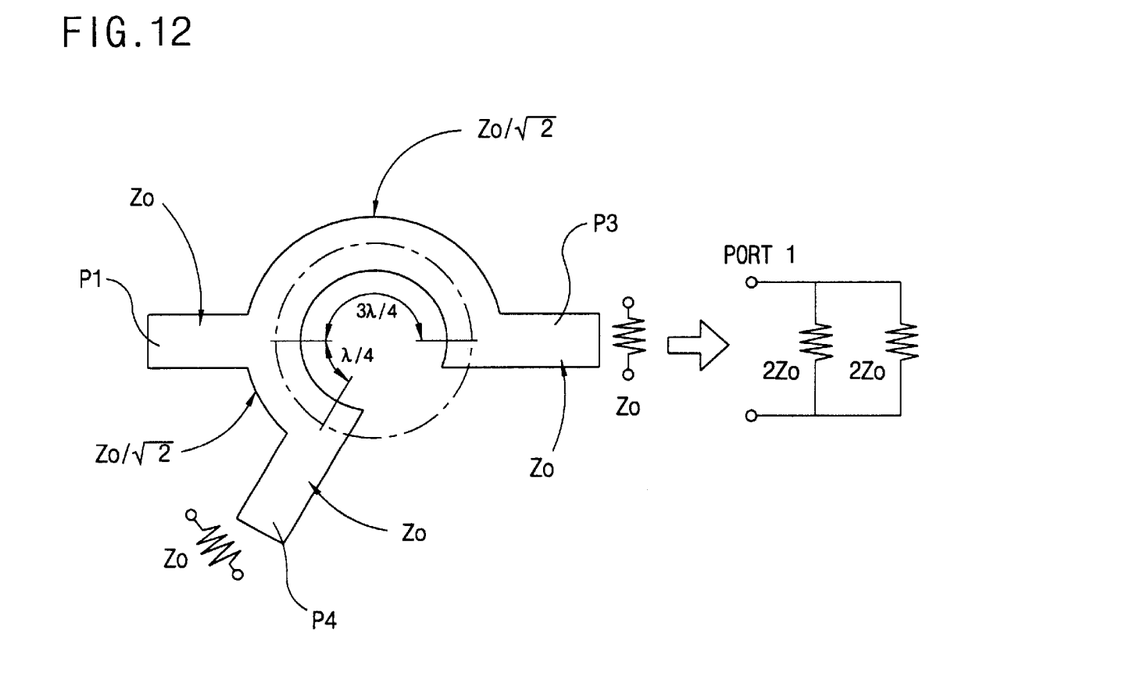
FIG. 12 is a view showing an equivalent circuit for analyzing a circuit structure of the ring hybrid coupler shown in FIG. 11.

FIG. 11 shows the structure of a ring hybrid coupler 127' according to another embodiment of the present invention. In the figure, the first port P1 receives the local oscillating signal and the second port P2 is connected to the rod antenna 120 so as to receive the radio frequency signal. It is possible to reversely arrange the first and second ports P1 and P2. The first to fourth ports P1, P2, P3 and P4 have the same characteristic impedance Zo and the annular ring has a characteristic impedance of $Zo/\sqrt{2}$. The first to fourth ports P1, P2, P3 and P4 are arranged around the annular ring 135 in a clockwise direction in order of the first, third, second and fourth ports P1, P3, P2 and P4. When a circumference length of the annular ring 135 is $6\lambda/4$, the first port P1 is spaced from the third port P3 by $3\lambda/4$, the second port P2 is spaced from the third port P3 by $\lambda/4$, the second port P2 is spaced from the fourth port P4 by $\lambda/4$, and the first port P1 is spaced from the fourth port by $\lambda/4$ in such a manner that the first to fourth ports P1, P2, P3 and P4 have phase differences with respect to each other. Accordingly, the first port P1 has the phase differences of $2\lambda/4$ and $4\lambda/4$ with respect to the second port P2 so that the first and second ports P1 and P2 have bidirectional phase differences of 180 degree and can be evaluated to have a good isolation with each other. As shown in FIG. 12, when it is difficult to design the ports of the ring hybrid coupler depending on a particular wave length, it can be alternative to design the ports to have the distances therebetween $(4n+1)\lambda/4$ and $(4n+3)\lambda/4$ rather than $\lambda/4$ and $3\lambda/4$. The ring hybrid coupler can be analyzed by using a scattering matrix with respect to the ports.

FIG. 12 shows the structure and an equivalent circuit for analyzing the input impedance of the annular ring when output ports are terminated. When the fourth port P4 is terminated, the impedance viewed from the first port P1 is represented as the equivalent circuit shown in the right side of FIG. 12. The impedance value viewed from the first port P1 is identical to the sum of characteristic impedance values of third and fourth ports P3 and P4 and the annular ring 135. At this time, the characteristic impedance value of the annular ring 135 is viewed as 2Zo which is the sum of $\lambda/4$ and $3\lambda/4$.

In addition, since the input power is uniformly distributed into the third and fourth ports P3 and P4, the following equations are obtained.

$$b_3 = j a_1/\sqrt{2}.$$

$$b_4 = -j a_1/\sqrt{2},$$

where $a_1$ is an incident wave at the first port P1, $b_3$ is a reflected wave at the third port P3 and $b_4$ is a reflected wave at the fourth port P4. When a signal is applied to the third port P3, the first and second ports P1 and P2 become the output port. At this time, $b_1=0$, $b_3=ja_2/\sqrt{2}$ and $b_4=-ja_2/\sqrt{2}$, and the $b_3$ and $b_4$ have the same phase. Based on these relations, the scattering matrix of the hybrid ring can be obtained as follows.

$$[S] = \begin{bmatrix} 0 & 0 & j\sqrt{2} & -j\sqrt{2} \\ 0 & 0 & -j\sqrt{2} & -j\sqrt{2} \\ j\sqrt{2} & -j\sqrt{2} & 0 & 0 \\ -j\sqrt{2} & -j\sqrt{2} & 0 & 0 \end{bmatrix}$$

The ring hybrid coupler is an E-plane T-junction having a ring shape. The characteristic impedance at the annular ring for satisfying the matching condition is $Zo/\sqrt{2}$.

Figure 13A:
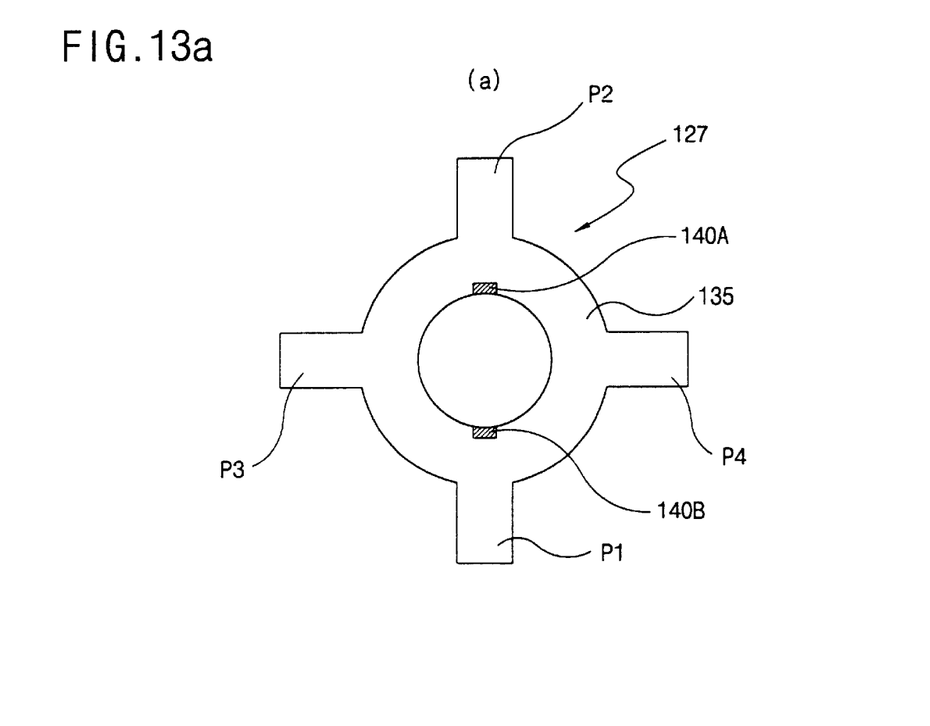
FIGS. 13a and 13b are views showing a T-junction of the ring hybrid coupler formed with an inductive iris.

On the other hand, a coupling area at which that the ports are connected to the annular ring has a structure the same with the T-junction. However, it is difficult for a device having three ports to obtain a preferred impedance feature since the impedance matching of the ports is difficult. For this reason, as shown in FIG. 13a, an inductive iris made of a thin conductive plate is attached to the T-junction areas of the annular ring 135, at which the electromagnetic wave signal inputted through the first and second ports P1 and P2 is distributed into the third and fourth ports P3 and P4, so as to reduce a reflection loss thereby increasing a transfer gain. Alternatively, post members 140A and 140B made of conductive material are accommodated in the T-junction areas for the same reason.

Figure 13B:
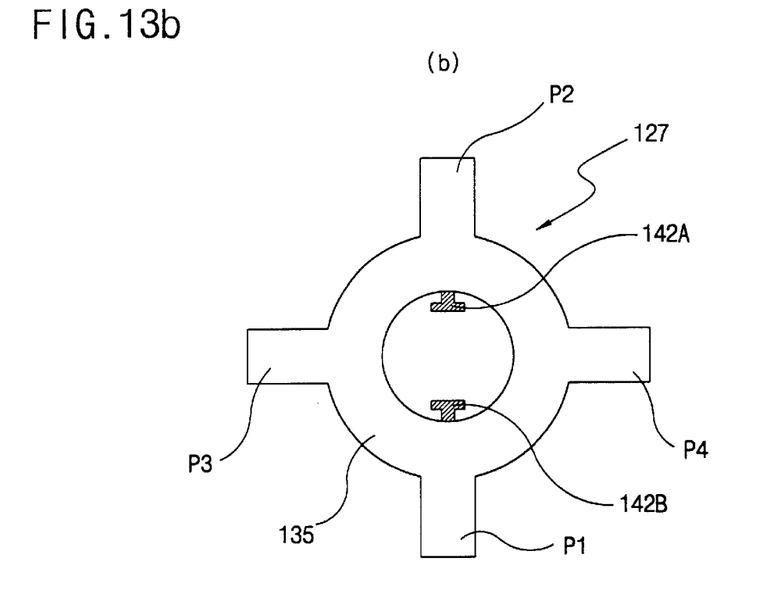

Besides the inductive iris, a stub can be provided at the T-junction areas of the first and second ports P1 and P2 so as to improve the signal isolation degree between the first and second ports P1 and P2 and so as to allow the signal to be stably distributed from the first and second ports P1 and P2 to the third and fourth ports P3 and P4. As shown in FIG. 13b, it is preferred to terminate first and second ports P1 and P2 by using stubs 142A and 142B. Preferably, the stubs 142A and 142B are made of dielectric material identical to material of the annular ring 135.

Figure 14:
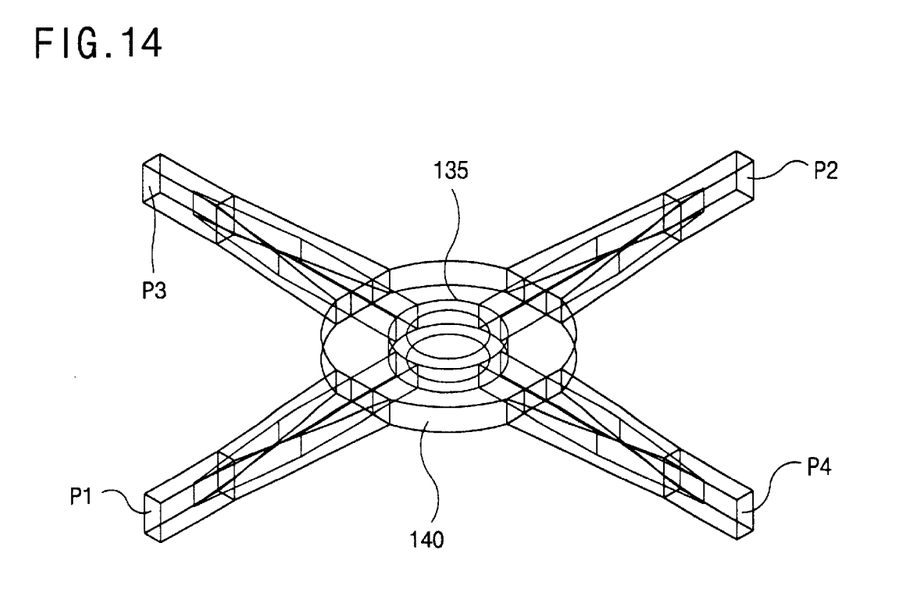
FIG. 14 is a schematic view showing an electromagnetic wave analyzing model for the ring hybrid coupler.

FIG. 14 shows an electromagnetic wave analyzing model for the ring hybrid coupler. The first to fourth ports P1, P2, P3 and P4 are symmetrically arranged and the ring hybrid coupler is surrounded by an air space 141. The remaining space is regarded as a perfect conductor. The signals inputted into the first and second ports P1 and P2 are coupled in the annular ring 135. The wave can be transmitted or attenuated by adjusting the phase of it in proportional to the wavelength.

Figure 15:
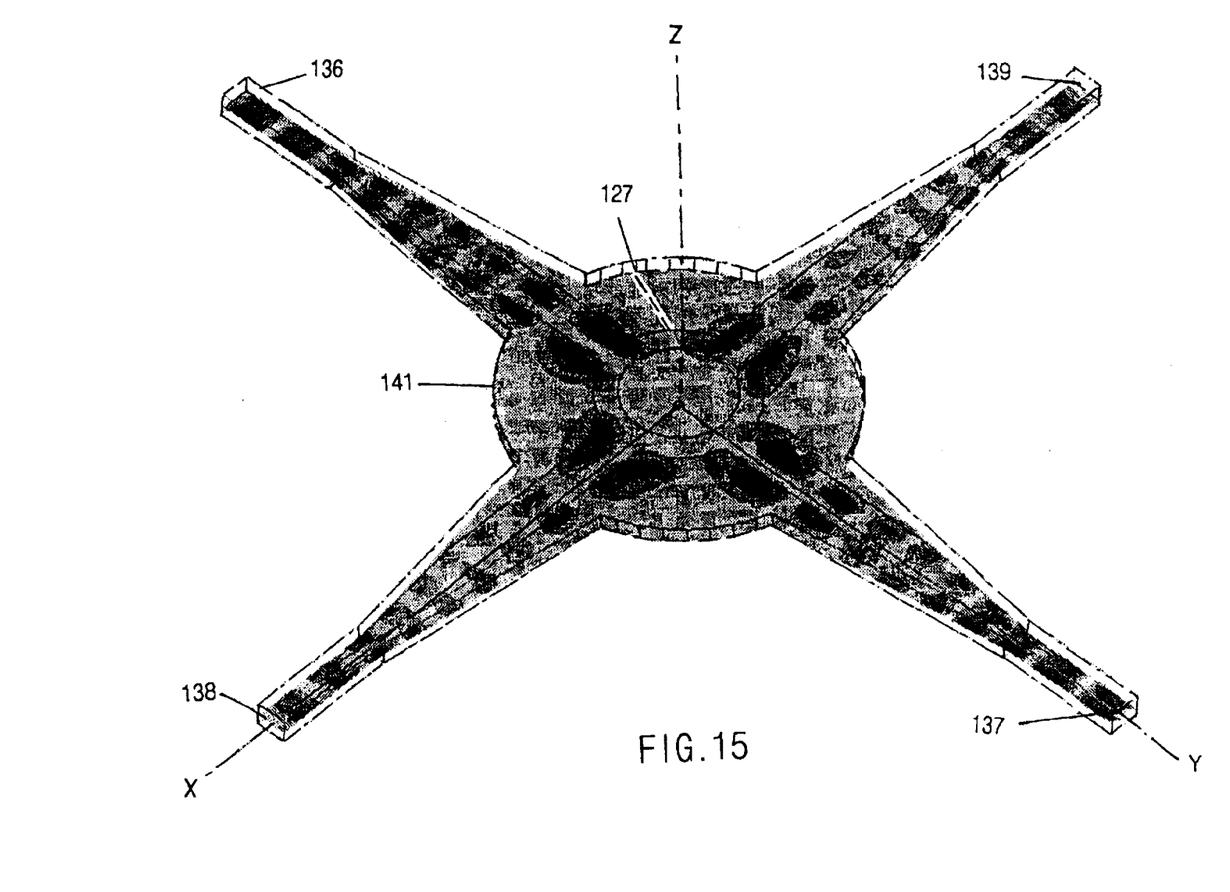
FIG. 15 is a view showing the size and direction of an electric field obtained by analyzing the electromagnetic wave analyzing model.

FIG. 15 is a view showing the intensity of the electric field obtained by analyzing the model shown in FIG. 14. When each port is symmetrically arranged and the wave having the same intensity is incident into the first and second ports P1 and P2, the wave is transmitted into the third and fourth ports P3 and P4. At this time, a desired signal isolation degree is obtained between the first and second ports P1 and P2. In addition, the LSM mode created in the first and second ports P1 and P2 is maintained in the third and fourth ports P3 and P4. It means that the ring hybrid coupler can be applicable to the NRD waveguide coupler and a divider as well as the balanced mixer.

As described above, it is difficult to fabricate the conventional NRD line coupler in a small size. However, the present invention employs the ring hybrid coupler which occupies a small space as compared with a bend type coupler so that the mixer can be fabricated in a small size with a light weight.

In addition, in the fabrication of the conventional NRD line coupler, it is required to precisely maintain the distance between two bends. However, it is difficult to precisely arrange the two bends. Furthermore, it is difficult to bend the two bends in a precise bending angle. On the contrary, the ring hybrid coupler of the present invention is integrally formed without forming the bends therein so that the ring hybrid coupler can be mass-produced by using an injection molding process.

In addition, the conventional parallel dielectric line coupler has not any particular device for obtaining the precise impedance matching, and the isolation degree between ports is poor. However, the ring hybrid coupler of the present invention can improve the impedance matching by using the inductive iris and the post member. In addition, the isolation degree and the transmitting feature between two ports can be improved by adding the stubs to the ring hybrid coupler. Furthermore, the ports can be designed to have various phase differences and the number of the ports can be increased.

In addition, the ring hybrid coupler of the present invention can adjust the wave mode of the signal from the LSM mode to the LSE mode or vise versa by using the T-junctions. Accordingly, the ring hybrid coupler can be applicable to the mode converter and the power divider as well as the mixer.

Although the preferred embodiments of the invention have been described, it will be understood by those skilled in the art that the present invention should not be limited to the described preferred embodiments, but various changes and modifications can be made within the spirit and scope of the invention as defined by the appended claims.

What is claimed is:

1. A NRD waveguide mixer comprising:
   a housing including a pair of opposed parallel conductive plates;
   a ring hybrid coupler installed in the housing, the ring hybrid coupler having an annular ring and first to fourth ports radially extending about the annular ring;
   an oscillating means connected to the first port so as to generate a local oscillating signal;
   a rod antenna connected to the second port so as to receive/transmit a radio frequency signal;
   a first balanced mixer mount connected to the third port and provided with a first Schottky diode; and
   a second balanced mixer mount connected to the fourth port and provided with a second Schottky diode,
   wherein the radio frequency signal inputted from the first port and the oscillating signal inputted from the second port are mixed in the ring hybrid coupler to be transformed into an addition signal and a subtraction signal, and the addition and subtraction signals are transmitted to the third and fourth ports to switch the first and second Schottky diodes, respectively, so that an intermediate signal is generated.

2. The NRD waveguide mixer as claimed in claim 1, wherein the first and second ports make contact with the annular ring to form T-junctions, an inductive iris made of a conductive thin plate is attached to each of the T-junctions or a conductive post is accommodated in each of the T-junctions for an impedance matching.

3. The NRD waveguide mixer as claimed in claim 1, wherein stubs are provided at an inner side of the annular ring in directions opposite to extending directions of the first and second ports for an impedance matching.

4. The NRD waveguide mixer as claimed in claim 1, wherein the first to fourth ports have the same characteristic impedance Zo, the annular ring has a characteristic impedance of $Zo/\sqrt{2}$, a circumference length of the annular ring at a middle portion thereof is substantially $\lambda$, and the first to fourth ports are arranged spaced by $\lambda/4$ from each other around the annular ring.

5. The NRD waveguide mixer as claimed in claim 1, wherein the first to fourth ports have the same characteristic impedance Zo, the annular ring has a characteristic impedance of $Zo/\sqrt{2}$, the first to fourth ports are arranged around the annular ring in a clockwise direction in order of first, third, second and fourth ports, and when a circumference length of the annular ring is $6\lambda/4$, the first port is spaced from the third port by $3\lambda/4$, the second port is spaced from the third port by $\lambda/4$, the second port is spaced from the fourth port by $\lambda/4$, and the first port is spaced from the fourth port by $\lambda/4$ in such a manner that the first to fourth ports have phase differences with respect to each other.

* * * * *